United States Patent
Hendrickson

(10) Patent No.: US 7,193,451 B2
(45) Date of Patent: Mar. 20, 2007

(54) METHOD AND SYSTEM FOR REDUCING GLITCH EFFECTS WITHIN COMBINATIONAL LOGIC

(75) Inventor: Eric O. Hendrickson, Lakeville, MN (US)

(73) Assignee: Honeywell International, Inc., Morristown, NJ (US)

( * ) Notice: Subject to any disclaimer, the term of this patent is extended or adjusted under 35 U.S.C. 154(b) by 18 days.

(21) Appl. No.: 11/041,766

(22) Filed: Jan. 24, 2005

(65) Prior Publication Data

US 2006/0164143 A1    Jul. 27, 2006

(51) Int. Cl.
*H03K 3/00* (2006.01)

(52) U.S. Cl. .................. 327/199; 327/34; 327/197; 327/198; 327/427; 327/428

(58) Field of Classification Search .............. 327/34, 327/197, 198, 199, 427, 434
See application file for complete search history.

(56) References Cited

U.S. PATENT DOCUMENTS

| | | | | |
|---|---|---|---|---|
| 5,767,718 A | * | 6/1998 | Shih | 327/228 |
| 6,285,247 B1 | * | 9/2001 | Shoji | 327/544 |
| 6,356,101 B1 | | 3/2002 | Erstad | 326/27 |
| 6,894,540 B1 | * | 5/2005 | Ali et al. | 327/34 |
| 2005/0007182 A1 | * | 1/2005 | Ando | 327/534 |

OTHER PUBLICATIONS

U.S. Appl. No. 10/452,557, filed May 30, 2003, entitled Radiation-Hard Circuit.

U.S. Appl. No. 60/384,585, filed May 31, 2002, entitled SET/SEU Hardened Stacked-Gate Circuits.
U.S. Appl. No. 11/005,265, filed Dec. 6, 2004, entitled Pulse Rejection Inverter For Hardening Against Single Event Transient (Set).
International Search Report, Nov. 11, 2004.
K. J. Hass et al., "Mitigating Single Event Upsets from Combinational Logic", 7th NASA Symposium on VLSI Design, 1998.
D.G. Mavis et al., "Draft Final Report: Development of a Design Methodology for Preventing Single Event Disruptions in Deep Submicron Microcircuits", Aug. 8, 2000.
D. G. Mavis, "Single Event Transient Phenomena—Challenges and Solutions", 2002 Microelectronics Reliability and Qualification Workshop, Dec. 3-4, 2002.

(Continued)

*Primary Examiner*—Quan Tra
*Assistant Examiner*—Khareem E Almo
(74) *Attorney, Agent, or Firm*—McDonnell Boehnen Hulbert & Burghoff LLP

(57) ABSTRACT

A method and system for reducing glitch effects in combinational logic is presented. If combinational logic incurs a particle-induced single event transient (SET) signal, a glitch reducing circuit, which is connected in a signal path between the combinational logic and downstream logic, will prevent the SET from propagating to the downstream logic. The glitch reducing circuit functions as a signal filter that provides a SET-filtered drive signal to downstream logic. The glitch reducing circuit receives both the input to the combinational logic and the output from the combinational logic. The input acts to enable or disable the glitch reducing circuit, so that for certain input values, the glitch reducing circuit passes the logic output signal to downstream logic, and for other input values, the glitch reducing circuit blocks the output signal from passing to downstream logic.

21 Claims, 6 Drawing Sheets

OTHER PUBLICATIONS

T. Holman, "Circuit and Layout Issues", Radiation Effects on Microelectronics Short Course 2001, Vanderbilt University, Dept. of EECS, 2001.

D.G. Mavis and P.H. Eaton, "SEU and SET Mitigation Techniques for FPGA Circuit and Configuration Bit Storage Design", http://klabs.org/richcontent/MAPLDCon00/Papers/Session_C/C5_Mavis_P.doc, printed on Aug. 26, 2004.

D.G. Mavis and P.H. Eaton, "SEU and SET Mitigation Techniques for FPGA Circuit and Configuration Bit Storage Design", 2000 Military and Aerospace Applications of Programmable Devices and Technologies Conference, Sep. 26-28, 2000.

L. W. Massengill, "Single Event Circuit Effects", Radiation Effects Course, Vanderbilt University, Aug. 2001.

J.D. Gambles et al., "Radiation Hardness of Ultra Low Power CMOS VLSI", http://www.cambr.uidaho.edu/symposiums/symp11/JodyGamblesPaper.pdf, printed on Aug. 26, 2004.

M. Kochar and K. Murchek, "Single Event Upsets in FPGAs", White Paper from QuickLogic Corporation, Rev. A, Sep. 2003.

* cited by examiner

METHOD AND SYSTEM FOR REDUCING GLITCH EFFECTS WITHIN COMBINATIONAL LOGIC

FIELD OF INVENTION

The present invention generally relates to particle-induced disturbances in electronic circuits and, more particularly, to reducing or eliminating transient pulse effects occurring within logic signals.

BACKGROUND

Signals in typical digital systems have two idealized states; namely, a low voltage state and a high voltage state. Unwanted transitions of a signal from a first voltage state to another, and then back to the first voltage state are often referred to as "glitches." Ideally, digital systems are designed to be glitch-free. In practice, however, glitches are difficult to eliminate.

Glitches may be caused by many factors including, for example, radiation effects. As such, many circuits are designed to include a level of "radiation hardness," i.e., an attribute of a circuit indicating the extent to which the circuit withstands nuclear or other radiation. Integrated digital circuits used in space, weapons, or aviation applications are typically designed to be more resistant to radiation than circuits used in other applications, because they are more likely to be exposed to radiation, and because their reliability is often more critical, for example. However, such solid-state circuits may still be vulnerable to radiation effects, such as disturbances caused by single, charged particles present within an ambient environment of the circuit. Some examples of these particles are:

Alpha particles: These are byproducts of the natural decay of elements such as uranium and thorium present in some integrated circuit packaging materials.

Energetic (having kinetic energy) protons, neutrons, electrons, heavy ions, and all the natural elements. These are abundant in intergalactic space, earth orbital space and even at high atmospheric altitudes (e.g., commercial flight altitudes) in a wide range of energies.

When a charged particle passes through a transistor (or any active electronic device), the particle loses energy by ionizing the medium through which the particle passes, leaving behind a track of hole-electron pairs. The electrons of the pairs will migrate toward high voltage state nodes of the struck transistor, resulting in a discharging current on that node. If the discharging current exceeds the current drive of the transistor holding the high voltage state on that node, the node will transition to an undesired low state. The holes of the pairs will migrate toward low voltage state nodes of the struck transistor resulting in a charging current on that node. If the charging current exceeds the current drive of the transistor holding the low voltage state on that node, the node will transition to an undesired high state. The number of hole-electron pairs created by the particle is finite, so the node voltage disturbance is temporary.

Particle-induced circuit disturbances are random and are commonly referred to as single-event effects (SEEs). The SEEs can take on many forms. If the particle strike results in a bit flip or other form of corruption of stored data, this is known as a single-event upset (SEU), or a soft error. If the particle causes a transient voltage disturbance on a node of a logic circuit, this is known as a single-event transient (SET).

A circuit node will typically return to a desired voltage state after an SET. Thus, an SET, in and of itself, may not be a problem. What is likely to be a problem is the consequence of having a temporary voltage disturbance on a circuit node. As an example, if the node is in a clock network, the SET can generate a false clock pulse in a portion of the system. If the node is in the logic that feeds data to an input of a latch (or other type of a memory element), there may or may not be a consequence from the SET. More particularly, if the data input recovers to the valid state from the SET before the latch closes, there is not likely to be a consequence. However, if the data input does not recover to the valid state from the SET before the latch closes, then the wrong data state is loaded into the latch. As a result, an SET-induced SEU occurs.

The susceptibility of modern integrated circuits to SETs can be heightened by reduced feature sizes of integrated circuits and higher clock speeds. As feature sizes continue to decrease, SETs are more likely to propagate through logic gates as normal logic pulses, causing upsets within logic circuits.

Existing circuits for reducing glitches and SETs have some drawbacks. For example, a stacked MOSFET arrangement can be used to prevent an SET from occurring in some circuits. However, this arrangement does not address suppressing an SET that already exists.

Another example circuit includes a stacked inverter arrangement. However, although a stacked inverter arrangement is hardened against creation of SETs from single particle strikes, the stacked inverter arrangement may similarly fail to detect or suppress SETs generated from upstream combination logic. In particular, a stacked-transistor inverter structure may ensure that there are always at least two "off" transistors between any critical circuit node (i.e., a node that, when disturbed, can cause an upset), and $V_{DD}/V_{SS}$. Thus, when/if a particle strikes one of the "off" stacked transistors, the other "off" transistor prevents the resulting current from reaching the critical node or from reaching $V_{DD}/V_{SS}$, and no SET occurs. Although the stacked-gate inverter is hardened against formation of SETs within the inverter itself, the stacked-gate inverter's single-input circuit structure generally does not provide hardening against SETs that may be generated by other logic elements and that may propagate onto the input signal to the stacked-gate inverter. As such, if a SET appears at the input to the stacked-gate inverter, the stacked-gate inverter will typically propagate the SET (or, more particularly, an inverted version of the SET) onto its output as it would any other legitimate logic pulse.

Furthermore, existing designs may require configurations that introduce a severe size penalty on the radiation hardening circuit due to the number of transistors used in the configuration. Thus, it would be desirable to provide a solution that "hardens" logic circuits against SETs that overcomes existing drawbacks.

SUMMARY

In an exemplary embodiment, a system for reducing glitch effects in combinational logic is presented. The system includes combinational logic that receives an input signal and provides an output signal. The system further includes a glitch reducing circuit including switched diodes. The glitch reducing circuit receives the output signal from the combinational logic as an input and the input signal to the combinational logic as an enable signal that controls operation of the glitch reducing circuit. In the event that the combinational logic experiences a glitch such that a logic value of the output signal is not an expected logic value, the glitch reducing circuit outputs a signal that has the expected logic value so as to suppress the glitch.

In one example, the glitch reducing circuit includes a first switched diode and a second switched diode. The first switched diode receives an output signal from combinational logic and the input signal to the combinational logic. The input signal controls whether the first switched diode performs as a diode or a short. The second switched diode receives an output of the first switched diode and further receives the input signal to the combinational logic. The input signal controls, in a complementary fashion compared to the first switched diode, whether the second switched diode performs as a diode or a short such that in the event that the combinational logic experiences a glitch such that a logic value of the output signal is not an expected logic value, the second switched diode outputs a signal that has the expected logic value so as to suppress the glitch.

The glitch reducing circuit may prevent effects of glitches within inverting or non-inverting combinational logic, switches, latches, etc. from propagating to downstream combinational logic.

In an example of operation with inverting combinational logic, the glitch reducing circuit includes a p-channel field effect transistor (PFET) and an n-channel field effect transistor (NFET). The PFET receives an output signal from the inverting combinational logic at a source of the PFET and receives the input signal to the combinational logic at a gate of the PFET. The NFET receives an output of the PFET at a source of the NFET and receives the input signal to the combinational logic at a gate of the NFET. The NFET outputs a correct logic complement of the input signal in the event that the inverting combinational logic experiences a glitch.

In an example of operation with non-inverting combinational logic, the glitch reducing circuit includes a p-channel field effect transistor (PFET) and an n-channel field effect transistor (NFET). The NFET receives an output signal from the non-inverting combinational logic at a source of the NFET and the input signal to the non-inverting combinational logic at a gate of the NFET. The PFET receives an output of the NFET at a source of the PFET and the input signal to the non-inverting combinational logic at a gate of the PFET. The PFET outputs a correct logic equivalent of the input signal in the event that the non-inverting combinational logic experiences a glitch.

These as well as other features, advantages and alternatives will become apparent to those of ordinary skill in the art by reading the following detailed description, with appropriate reference to the accompanying drawings.

DETAILED DESCRIPTION

In an exemplary embodiment, a method and system for reducing effects of glitches within combinational logic is presented. In one example, the system may prevent effects of glitches within inverting or non-inverting combinational logic, switches, latches, etc. from propagating to downstream combinational logic.

Figure 1:
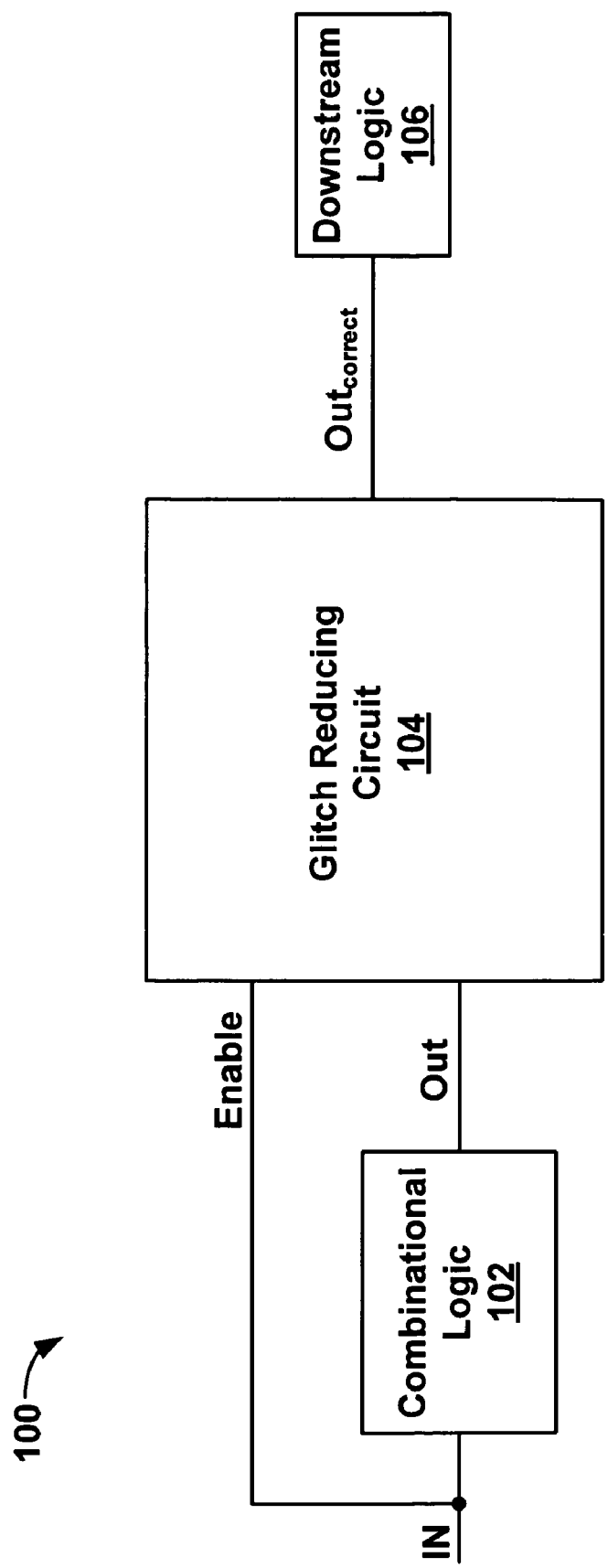
FIG. 1 illustrates one embodiment of a block diagram of a glitch reducing system.

Referring now to the figures, and more particularly to FIG. 1, one embodiment of a system 100 is illustrated. The system 100 includes combinational logic 102 coupled to a glitch reducing circuit 104, which outputs to downstream logic 106. The glitch reducing circuit 104 further receives the input to the combinational logic 102.

The combinational logic 102 may include combinational (or non-memory) logic elements that are susceptible to disturbances caused by particle strikes, such as SETs for example. If a particle-induced SET occurs within the combinational logic 102, a propagated SET may appear in the OUT signal in the form of a transient pulse (or signal glitch) that causes the OUT signal to transition temporarily to an incorrect logic state (e.g., a "low-to-high" logic transition, 0 $V_{DC}$ to +5 $V_{DC}$, or a "high-to-low" logic transition, +5 $V_{DC}$ to 0 $V_{DC}$) and then back to the correct state. Absent the glitch reducing circuit 104, the particle-induced SET would propagate through to the downstream logic 106.

In practice, if the combinational logic 102 propagates a particle-induced SET onto the OUT signal, the glitch reducing circuit 104, which is connected in a signal path between combinational logic 102 and downstream logic 106 as shown in FIG. 1, will prevent the SET from propagating to the downstream logic 106. As such, the glitch reducing circuit 104 may function as a signal filter that provides a SET-filtered drive signal to downstream logic 106. In effect, the downstream logic 106 may be hardened against SETs propagated onto the OUT signal by the elements of combinational logic 102, and the combinational logic 102 is substantially hardened against creation of SETs.

The glitch reducing circuit 104 receives both the input to the combinational logic 102 and the output from the combinational logic 102. The input acts to enable or disable the glitch reducing circuit 104, so that for certain input values, the glitch reducing circuit 104 passes the OUT signal to the downstream logic 106, and for other input values, the glitch reducing circuit 104 blocks the OUT signal from passing to the downstream logic 106. In this manner, the glitch reducing circuit 104 outputs a correct logic value to the downstream logic 106, based on operation of the combinational logic 102.

Figure 2:
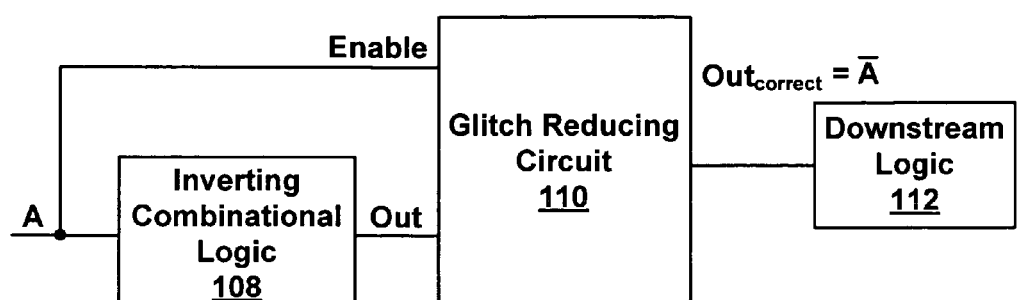
FIG. 2 illustrates one embodiment of a glitch reducing system including inverting combinational logic.

The glitch reducing circuit 104 may be arranged to protect operation of both inverting and non-inverting combinational logic. For example, FIG. 2 illustrates a system including inverting combinational logic 108, a glitch reducing circuit 110 and downstream logic 112.

The inverting combinational logic 108 may include conventional CMOS inverters or similar logic performing functions of an inverter. As known to those skilled in the art, the conventional CMOS inverter operates to assert an output logic signal that is a logic complement of an input signal to the inverter. A typical inverter includes a P-channel transistor and an N-channel transistor.

One of the shortcomings of the conventional CMOS inverter is that the inverter does not provide any hardening against single-event disturbances, such as SETs. As an example, consider a scenario in which a particle strike occurs on the N-channel transistor when the P-channel transistor is "on" and the N-channel transistor is "off". The particle strike may disturb the output voltage state of an output signal because the created charge in the N-channel transistor may result in a pull-down current within the N-channel transistor to the ground potential $V_{SS}$ competing against a pull-up current within the P-channel transistor to the positive supply voltage $V_{DD}$. If the pull-down current is sufficiently larger than the pull-up current that holds the voltage state of the output signal at "high", the output voltage will temporarily transition to the undesired "low" state. If the particle-induced output voltage state falls past the switch point of a following logic gate, then a SET can be propagated to a downstream logic.

The glitch reducing circuit 110 will prevent the SET from propagating to the downstream logic 112. The glitch reducing circuit 110 receives the output of the inverting combinational logic 108 and the input to the inverting combinational logic 108, and outputs a logic complement of the input, e.g., $\overline{A}$, to the downstream logic 112.

Figure 3:
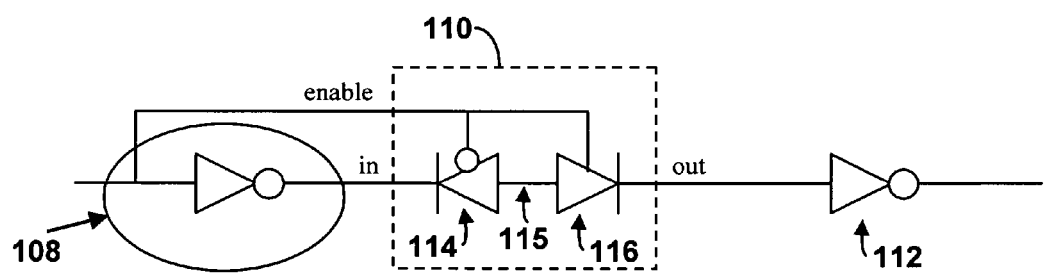
FIG. 3 illustrates one example of an arrangement of the glitch reducing circuit with inverting combinational logic.

FIG. 3 illustrates one example of an arrangement of the glitch reducing circuit 110 with inverting combinational logic 108. The glitch reducing circuit 110 includes a p-type switched diode 114 and an n-type switched diode 116. The output of the inverting combinational logic 108 is received by the p-type switched diode 114 and either passed to the n-type switched diode 116 or blocked by the p-type switched diode 114 based on the signal seen on the enable input. Similarly, the n-type switched diode 116 either passes or blocks the signal seen at line 115 based on the signal received at its enable input. Both the p-type switched diode 114 and the n-type switched diode 116 receive the input to the inverting combinational logic 108 to their respective enable inputs.

Figure 4:
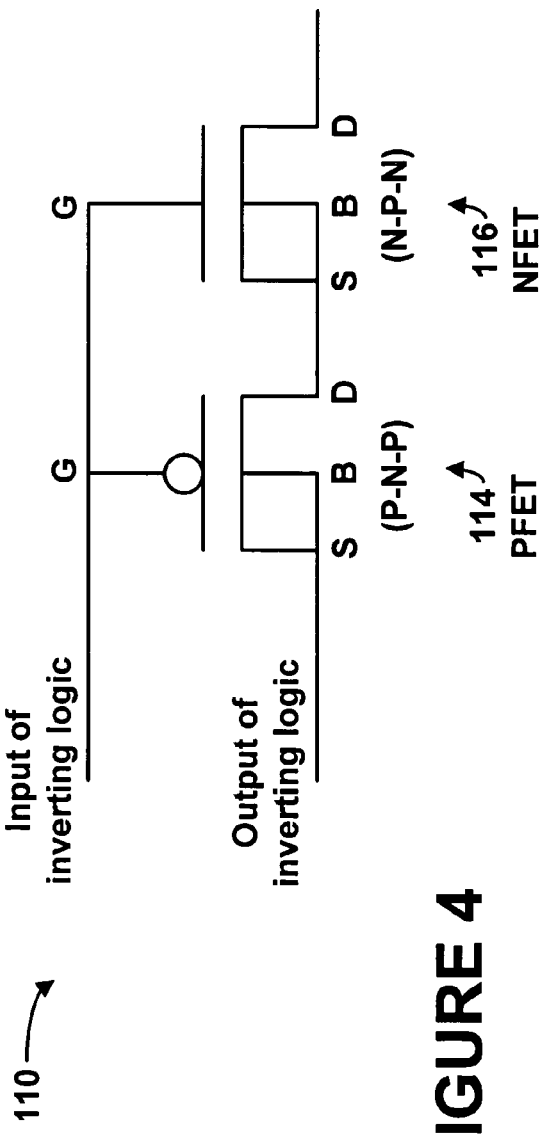
FIG. 4 illustrates one example of the glitch reducing circuit.

FIG. 4 illustrates one example of the glitch reducing circuit 110, as described in relation to FIGS. 2–3. The glitch reducing circuit 110 includes the p-type switched diode 114, shown as a p-channel Field Effect Transistor (PFET), and the n-type switched diode 116, shown as an n-channel Field Effect Transistor (NFET). Field effect transistors conventionally have a gate, a source, a drain, and a body (or substrate) terminal. The technology that utilizes both P- and N-channel devices is known in the art as the Complementary Metal Oxide Semiconductor (CMOS) technology.

In practice, a FET is controlled (i.e., turned "on" or "off") by a voltage that is applied at a gate of the transistor. In particular, when a voltage of sufficient magnitude (typically greater than a given threshold voltage for an NFET and less than a given threshold voltage for a PFET) is applied to the gate of the transistor in an "off" state, a conductive channel is induced within the transistor such that a current flows between a drain and a source, turning the transistor "on".

Several possible configurations exist for the glitch reducing circuit 110. For example, as shown in FIG. 4, the PFET body and source can be connected to the output of the inverting combinational logic 108. The NFET body and source are connected to the PFET drain. The NFET drain is tied to the downstream logic 112 while the NFET and PFET gates are tied to the inverting combinational logics input.

In operation, an input is received at the source of the PFET 114 and passed to the drain of the PFET if the signal received on the gate is a logic zero. Thus, the PFET will be turned on and will perform as a short.

Figure 5:
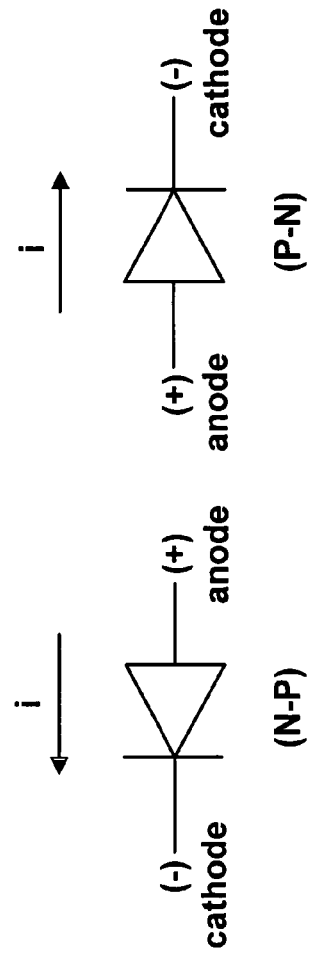
FIG. 5 illustrates one example of general operation of the glitch reducing circuit.

If the signal received to the gate of the PFET is a logic one, then the PFET performs as a diode, since the body is tied to the source which creates P-N junction between the body and the induced channel having a constant zero bias. In such a case, the base does not play a role in circuit operation and its existence may be ignored altogether. Thus, if the signal to the gate is a logic one, the PFET behaves as a normal diode, allowing current to flow only in one direction, as shown in FIG. 5.

The NFET operates in a complimentary fashion. For example, if the signal on the gate of the NFET is a logic high, then the NFET is turned on and will perform as a short such that the NFET will pass the signal received from the drain of the PFET to the drain of the NFET. If the signal on the gate of the NFET is a logic low, then the NFET will behave as an N-P-N diode, and will pass current only in one direction as shown in FIG. 5, since the P-N junction of the body-drain is forward biased and current is allowed to flow.

Thus, the glitch reducing circuit 110 behaves like a "state-dependant diode." For example, if the gates are held at a logic high, then the glitch reducing circuit 110 will behave like a P-N diode. Conversely, if the gates are held at a logic low, then the glitch reducing circuit 110 will behave like an N-P diode. This behavior can be used to protect an inverted signal from propagating a glitch. In this way, the glitch reducing circuit 110 can be inserted in series with an signal line that has a complement (i.e., an inverter), and can be used to protect individual logic cells, and latches from SETs, and can be used in series with a delay element to operate as a glitch swallower, for example.

If a glitch occurs within the inverting combinational logic 108, the glitch will not propagate through the glitch reducing circuit 110 because either the PFET or NFET diode will be reverse-biased and will disallow current to flow.

Table 1 illustrates example operation of the glitch reducing circuit 110. For example, if the input to the inverting logic 108 is a logic one, the output of the inverting combinational logic 108 is a logic zero, and the input to the PFET 114 is a logic zero and the gate is thus a logic 1 (e.g., value of the input to the inverting combinational logic 108). Thus, the PFET is turned off, and behaves as a diode allowing current to flow from the drain to the source. As a result, the source of the NFET is logic zero (e.g., no charge). The NFET is turned on, since its gate is a logic 1, and the NFET passes the logic zero to the output pin. Thus, the glitch reducing circuit 110 properly output a logic zero for an input of a logic one to the inverting logic 108.

If a glitch were to occur in the inverting logic 108 in this example (e.g., the output temporarily glitched from logic 0-1-0), the PFET would still be turned off, since the gate of the PFET still receives a logic one. Thus, the output of the NFET remains the same.

TABLE 1

| Input to inverting logic | Input to PFET | | Input to NFET | | Output |
|---|---|---|---|---|---|
| | Source | Gate | Source | Gate | |
| 0 | 1 | 0 | 1 | 0 | 1 |
| 0 (Glitch) | 0 | 0 | 0 | 0 | 1 |
| 1 | 0 | 1 | 0 | 1 | 0 |
| 1 (Glitch) | 1 | 1 | 0 | 1 | 0 |

Also, as shown in Table 1, if the input to the inverting combinational logic 108 is a logic low, then the PFET is turned on, and passes the logic high signal to the NFET. In this case, the NFET is turned off, but performs as a PN diode since it is forward biased, and will pass the logic one to the downstream logic 112. As a result, the input to the inverting combinational logic was a logic low and the glitch reducing circuit 110 output a logic high as would be expected.

If a glitch were to occur in the inverting logic 108 in this example (e.g., output of the inverting logic glitches from logic 1-0-1), the NFET would still be turned off and the PFET will still be turned on, since the gate of the NFET still receives a logic zero. Thus, the NFET still passes the signal received from the PFET. When a glitch occurs, it is assumed that the inverting logic 108 is operating properly (e.g., the inverting logic 108 output a logic high), but the logic high signal is affected and temporarily switches to a logic low. Thus, the PFET 114 receives the logic high signal and then soon thereafter receives the "glitched" logic low signal. So, here the NFET will receive the logic high signal from the PFET and pass it to the output pin. When the NFET next receives the glitched logic low signal, the NFET will not pass the signal, because the NFET is turned off and operating as a diode. Thus, the NFET will only pass a signal in this condition when the source (e.g., anode) has a more positive voltage than the drain (e.g., cathode). When the glitched logic low signal reaches the source of the NFET, the source will be at a lower voltage than the drain, since the NFET previously output the proper logic high signal. As a result, the glitch reducing circuit 110 swallowed the glitch. The circuit 110 performs similarly when a glitch occurs for logic high inputs, for example.

Figure 6:
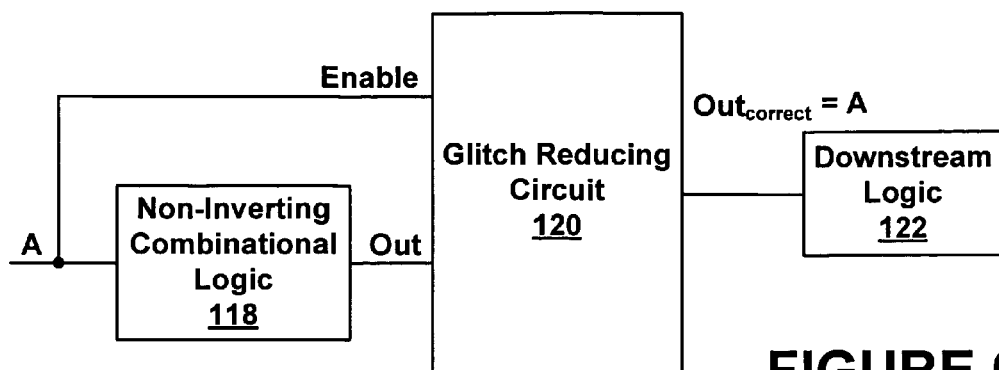
FIG. 6 illustrates one embodiment of a glitch reducing system including non-inverting combinational logic.

The glitch reducing circuit 104 may also be arranged to protect operation of non-inverting combinational logic. FIG. 6 illustrates a system including non-inverting combinational logic 118, a glitch reducing circuit 120 and downstream logic 122. The non-inverting combinational logic 118 outputs a logic signal that has a logic value equal to the logic value of the input to the non-inverting combinational logic 118.

Figure 7:
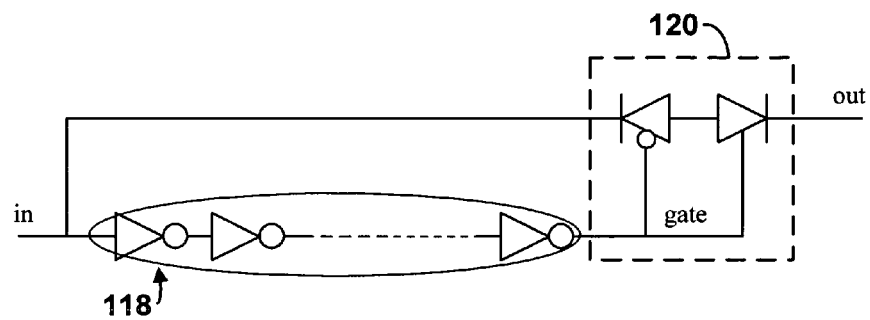
FIG. 7 illustrates one example of an arrangement of the glitch reducing circuit with inverting combinational logic.

FIG. 7 illustrates one example of an arrangement of the glitch reducing circuit 120 with non-inverting combinational logic 118. In general, delay elements in logic circuits may be implemented using a number of logic inverter gates connected in a series configuration. A typical logic inverter gate has a finite delay, or propagation delay, such that a signal passing through the inverter gate is delayed for a time by the delay of the gate. If multiple logic inverter gates are connected in series to create a delay chain, the total propagation delay of the chain will be substantially equal to the sum of the propagation delays of each individual inverter gate within the chain. In addition, if an even number of inverter gates is used to construct the delay chain, the delay chain will realize a non-inverting logic function. Accordingly, a non-inverting delay circuit can be constructed using a plurality of delay inverters connected in an inverting series configuration to produce a time-delayed version of an input signal provided to the delay circuit.

The glitch reducing circuit 120 in FIG. 7 operates to swallow glitches that occur at the output of the non-inverting logic 118, for example. Here, the glitch reducing circuit 120 includes a PFET that receives the input to the non-inverting combinational logic 118 and outputs to an NFET, which outputs to the downstream logic. The gates of the PFET and NFET receive the output from the non-inverting logic 118. The glitch reducing circuit 120 swallows any glitch that may occur within the delay chain 118.

Figure 8:
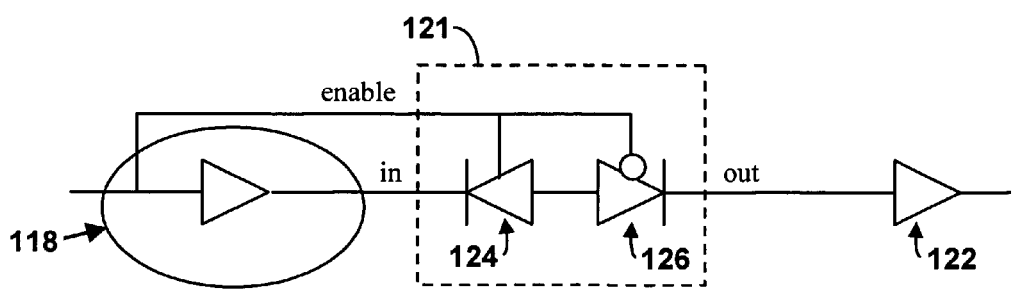
FIG. 8 illustrates one example of an alternate arrangement of the glitch reducing circuit with the non-inverting logic.

FIG. 8 illustrates another example of an arrangement of the glitch reducing circuit 120. Here, a glitch reducing circuit 121 includes an n-type switched diode, e.g., an NFET 124, and a p-type switched diode, e.g., an PFET 126, as in the previous arrangement. The NFET 124 receives the output of the non-inverting combinational logic 118 and outputs to the PFET 126, which outputs to the downstream logic 122.

Figure 9:
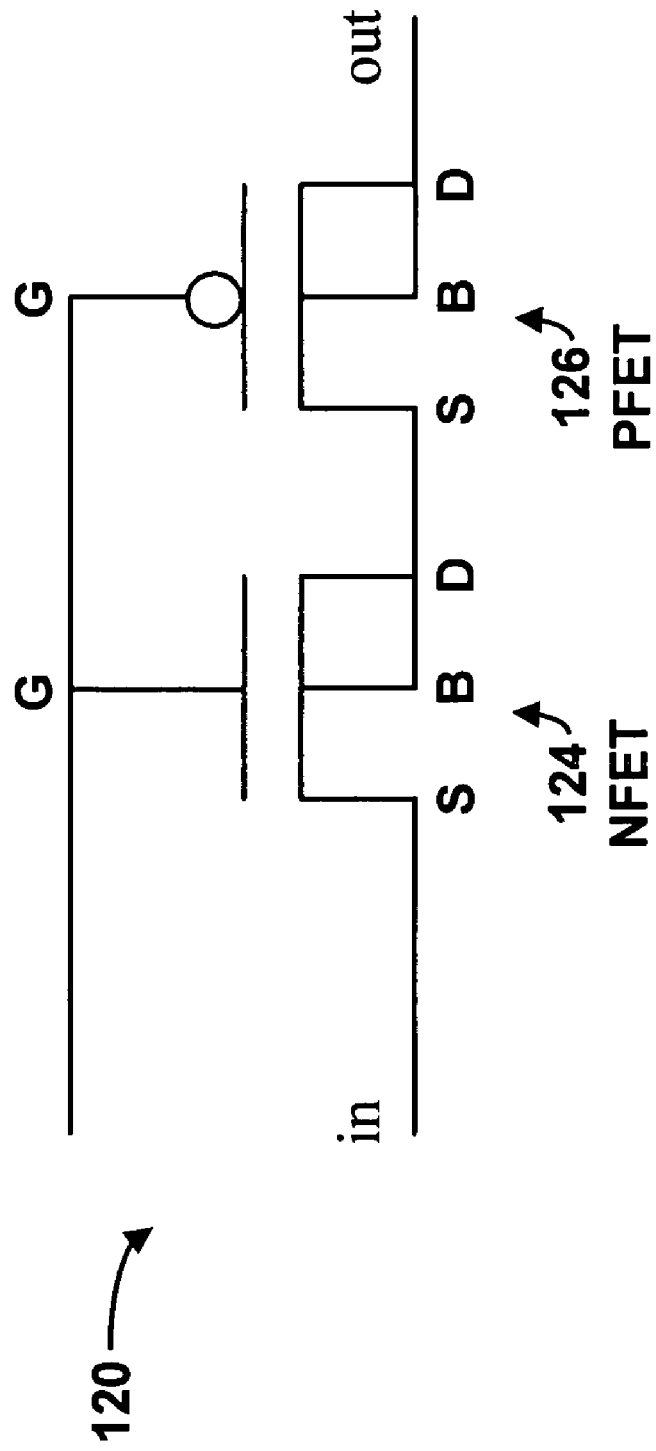
FIG. 9 illustrates another example of an arrangement of the glitch reducing circuit with the non-inverting logic.

FIG. 9 illustrates one example of an arrangement for the NFET 124 and PFET 126 to operate as a glitch reducing circuit for non-inverting combinational logic. As shown, the base of each of the NFET 124 and the PFET 126 are connected to their respective drains. Example operation of the glitch reducing circuit 121 is shown below in Table 2.

TABLE 2

| Input to non-inverting logic | Input to NFET | | Input to PFET | | Output |
|---|---|---|---|---|---|
| | Source | Gate | Source | Gate | |
| 0 | 0 | 0 | 0 | 0 | 0 |
| 0 (Glitch) | 1 | 0 | 0 | 0 | 0 |
| 1 | 1 | 1 | 1 | 1 | 1 |
| 1 (Glitch) | 0 | 1 | 0 | 1 | 1 |

The NFET 124 and PFET 126 combination operate in a similar manner as described above in relation to FIG. 4.

Figure 10:
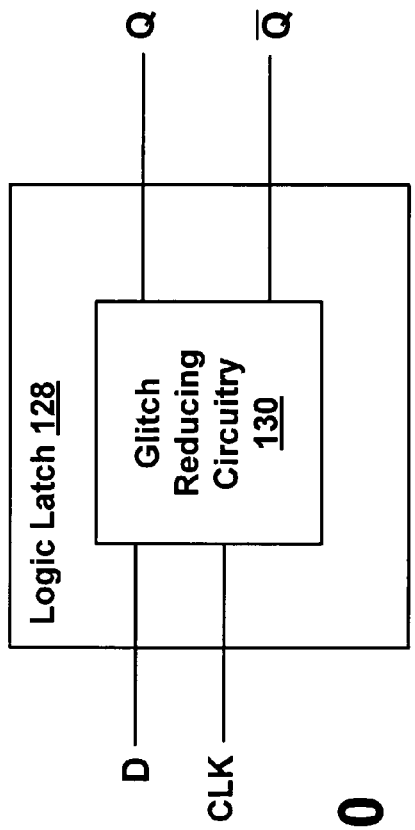
FIG. 10 is a block diagram illustrating one embodiment of glitch reducing circuitry within a D flip-flop.
Figure 11:
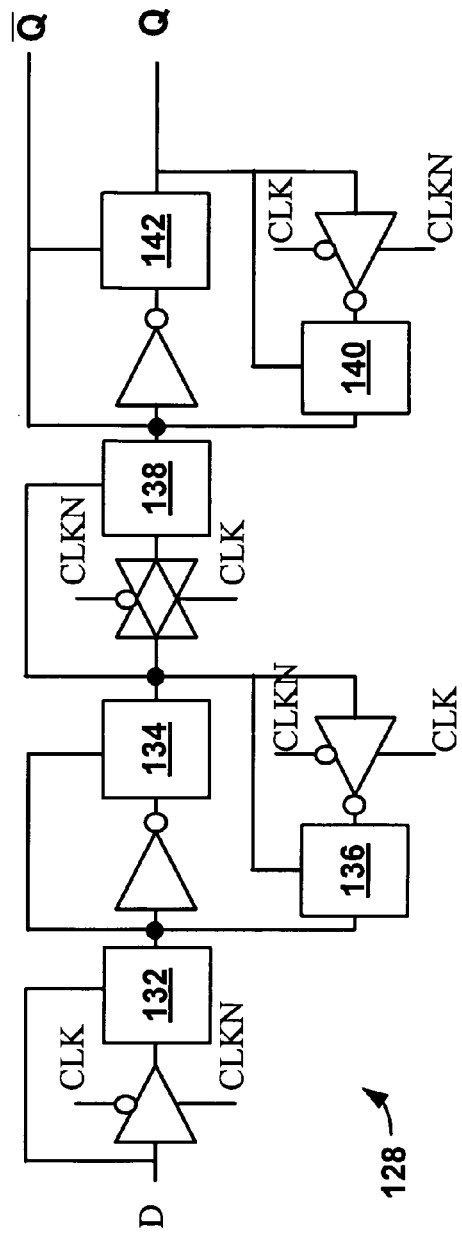
FIG. 11 is a block diagram illustrating one embodiment of an arrangement of the glitch reducing circuitry in the D flip-flop.

The glitch reducing circuit may also be used within latches, flip-flops, or other logic blocks. For example, FIG. 10 is a block diagram illustrating glitch reducing circuitry 130 within a D flip-flop 128. FIG. 11 is a block diagram illustrating details of the D flip-flop 128. As shown, the D flip-flop 128 includes non-inverting glitch reducing circuitry 132 and 138, and inverting glitch reducing circuitry 134, 136, 140 and 142.

The D flip-flop 128 operates as a standard flop-flop as known in the art. The CLK and CLKN are labeled separately, but the two signals can be split off of one clock signal that uses an inverter to create CLK and CLKN. All the tri-stated devices are used to clock a master and slave stage of the D flip-flop 128. When the input tri-state buffer is active (e.g., which passes the value on D into the flip flop), then the feedback tri-state inverter associated with the 'master' stage is turned off (e.g., so that a new value will not be contested by a previously latched value), the 'master to slave' passgate is turned off, and the feedback on the slave is active, latching the slave state, for example.

The non-inverting glitch reducing circuitry 132 and 138, and inverting glitch reducing circuitry 134, 136, 140 and 142 within the D flip-flop 128 operate as described above to swallow and prevent glitches from propagating through the D flip-flop 128, for example.

Within embodiments described herein, the glitch reducing circuit may be used in situations to suppress an SET in latches, flip-flops, or logic blocks, for example. The glitch reducing circuit can be realized using a small number of components, and thus, die area on chips can be preserved.

Since many modifications, variations, and changes in detail can be made to the described embodiments, it is intended that all matters in the foregoing description and shown in the accompanying drawings be interpreted as illustrative and not in a limiting sense, and it is intended to be understood that the following claims including all equivalents define the scope of the invention.

What is claimed is:

1. A system comprising:
   combinational logic operable to receive an input signal and to provide an output signal; and
   a glitch reducing circuit including switched diodes, the glitch reducing circuit receiving the output signal from the combinational logic as an input and the input signal to the combinational logic as an enable signal that controls operation of the glitch reducing circuit, and in the event that the combinational logic experiences a glitch such that a logic value of the output signal is not an expected logic value, the switched diodes operate to output a signal having the expected logic value so as to suppress the glitch,
   wherein the glitch reducing circuit consists of one P-type transistor and one N-type transistor.

2. The system of claim 1, wherein if the glitch occurs, the output of the combinational logic temporarily is not the expected logic value and the switched diodes block the temporary signal from propagating to downstream logic.

3. The system of claim 1, wherein the combinational logic provides as the output signal a logic signal that is a logic equivalent of the input signal.

4. The system of claim 3, wherein the combinational logic comprises an even number of logic inverter gates connected in series to create a delay chain.

5. The system of claim 1, wherein the combinational logic is inverting logic operable to receive the input signal and to provide as the output signal a logic complement of the input signal, and wherein in the event that the inverting combinational logic experiences the glitch, the glitch reducing circuit outputs a correct logic complement of the input signal.

6. The system of claim 1, wherein the combinational logic is hardened against disturbances caused by single particle strikes.

7. The system of claim 1, wherein the input signal controls operation of the glitch reducing circuit by enabling or disabling the switched diodes.

8. The system of claim 1, wherein if the switched diodes are disabled, current flows only in one direction through the switched diodes and if the switched diodes are enabled, the switched diodes perform as a short in the glitch reducing circuit.

9. A glitch reducing circuit comprising:
   a first switched diode receiving an output signal from combinational logic, wherein the combinational logic is operable to receive an input signal and provide the output signal, the first switched diode further receiving the input signal to the combinational logic, wherein the input signal controls whether the first switched diode performs as a diode or a short; and
   a second switched diode receiving an output of the first switched diode and further receiving the input signal to the combinational logic, wherein the input signal controls, in a complementary fashion as compared to the first switched diode, whether the second switched diode performs as a diode or a short such that in the event that the combinational logic experiences a glitch such that a logic value of the output signal is not an expected logic value, the second switched diode outputs a signal having the expected logic value so as to suppress the glitch.

10. The glitch reducing circuit of claim 9, wherein the first switched diode is a P-type transistor and the second switched diode is an N-type transistor.

11. The glitch reducing circuit of claim 10, wherein the combinational logic is inverting logic operable to receive the input signal and to provide as the output signal a logic complement of the input signal.

12. The glitch reducing circuit of claim 9, wherein the first switched diode is an N-type transistor and the second switched diode is a P-type transistor.

13. The glitch reducing circuit of claim 12, wherein the combinational logic provides as the output signal a logic signal that is a logic equivalent of the input signal.

14. A method of hardening against single event effects (SEE) comprising:
   receiving at a first input of a glitch reducing circuit an input signal directed to combinational logic, wherein the combinational logic is operable to receive the input signal and to provide as an output signal a logic signal that has an expected logic value which is known;
   receiving at a second input of the glitch reducing circuit the output signal from the combinational logic; and
   in the event that the combinational logic experiences a glitch such that a logic value of the output signal is temporarily not the expected logic value, outputting from the glitch reducing circuit a logic signal having the expected logic value so as to suppress the glitch,
   wherein the glitch reducing circuit consists of one P-type transistor and one N-type transistor.

15. The method of claim 14, wherein if the glitch occurs, the output of the combinational logic temporarily is not the expected logic value, and the method further comprises blocking the temporary signal from propagating to downstream logic.

16. A glitch reducing circuit comprising:
   a p-channel field effect transistor (PFET) receiving an output signal from inverting combinational logic at a source of the PFET, wherein the inverting combinational logic is operable to receive an input signal and to provide as the output signal a logic signal that is a logic complement of the input signal, the PFET further receiving the input signal to the inverting combinational logic at a gate of the PFET; and
   an n-channel field effect transistor (NFET) receiving an output of the PFET at a source of the NFET and receiving the input signal to the inverting combinational logic at a gate of the NFET, wherein the NFET outputs a correct logic complement of the input signal in the event that the inverting combinational logic experiences a glitch.

17. The glitch reducing circuit of claim 16, wherein a base of the PFET is connected to the source of the PFET and a base of the NFET is connected to the source of the NFET.

18. The glitch reducing circuit of claim 16, wherein the PFET and NFET arrangement prevent a glitch from propagating beyond the inverting combinational logic.

19. A glitch reducing circuit comprising:
   an n-channel field effect transistor (NFET) receiving an output signal from non-inverting combinational logic at a source of the NFET, wherein the non-inverting combinational logic is operable to receive an input signal and to provide as the output signal a logic signal that is a logic equivalent of the input signal, the NFET further receiving the input signal to the non-inverting combinational logic at a gate of the NFET; and
   a p-channel field effect transistor (PFET) receiving an output of the NFET at a source of the PFET and receiving the input signal to the non-inverting combinational logic at a gate of the PFET, wherein the PFET outputs a correct logic equivalent of the input signal in the event that the non-inverting combinational logic experiences a glitch.

20. The glitch reducing circuit of claim 19, wherein a base of the PFET is connected to a drain of the PFET and a base of the NFET is connected to a drain of the NFET.

21. A latch circuit comprising:
a D flip-flop combinational logic operable to receive an input signal and to provide an output signal; and
a plurality of glitch reducing circuits within the D flip-flop combinational logic, each glitch reducing circuit including complimentary switched diodes, and in the event that the D flip-flop combinational logic experiences a glitch such that a logic value of an output signal of logic within the D flip-flop is temporarily not an expected logic value, at least one of the glitch reducing circuits corrects the output signal of the logic within the D flip-flop to be the expected logic value so as to suppress the glitch.

* * * * *